United States Patent
Nien

(10) Patent No.: US 11,742,856 B2
(45) Date of Patent: Aug. 29, 2023

(54) DIGITAL BUFFER DEVICE WITH SELF-CALIBRATION

(71) Applicant: ELITE SEMICONDUCTOR MICROELECTRONICS TECHNOLOGY INC., Hsinchu (TW)

(72) Inventor: Shu-Han Nien, Hsinchu (TW)

(73) Assignee: ELITE SEMICONDUCTOR MICROELECTRONICS TECHNOLOGY INC., Hsinchu (TW)

( * ) Notice: Subject to any disclaimer, the term of this patent is extended or adjusted under 35 U.S.C. 154(b) by 27 days.

(21) Appl. No.: 17/535,725

(22) Filed: Nov. 26, 2021

(65) Prior Publication Data

US 2023/0170903 A1    Jun. 1, 2023

(51) Int. Cl.
*H03K 19/003* (2006.01)
*H03K 19/00* (2006.01)
*G11C 7/10* (2006.01)

(52) U.S. Cl.
CPC ... *H03K 19/00384* (2013.01); *H03K 19/0027* (2013.01); *G11C 7/1057* (2013.01); *G11C 7/1084* (2013.01)

(58) Field of Classification Search
None
See application file for complete search history.

(56) References Cited

U.S. PATENT DOCUMENTS

| 5,157,277 | A | | 10/1992 | Tran et al. |
| 6,023,174 | A | * | 2/2000 | Kirsch ............. H03K 19/00384 326/31 |
| 6,177,819 | B1 | | 1/2001 | Nguyen |

FOREIGN PATENT DOCUMENTS

CN          107528658 A          12/2017

* cited by examiner

*Primary Examiner* — Jany Richardson

(57) ABSTRACT

A digital buffer device with self-calibration includes a first buffer circuit, detection circuit, and calibration circuit. The first buffer circuit has a buffer input terminal for receiving an input signal and a buffer output terminal as output of the digital buffer device. The detection circuit includes at least one second buffer circuit for receiving at least one reference signal and generating at least one detection signal to indicate circuit characteristic variations of the at least one second buffer circuit. The at least one second buffer circuit is of a same type of buffer as the first buffer circuit. The calibration circuit has a calibration input terminal for receiving the input signal, and a calibration output terminal coupled to the buffer output terminal. The calibration circuit is for calibrating the first buffer circuit to generate an output signal according to the input signal and the at least one detection signal.

11 Claims, 7 Drawing Sheets

2A

DIGITAL BUFFER DEVICE WITH SELF-CALIBRATION

BACKGROUND OF THE INVENTION

1. Field of the Invention

The present disclosure relates to a digital buffer device, and in particular to a digital buffer device with self-calibration.

2. Description of the Related Art

A memory system, such as a memory device according to double-data-rate (DDR) series or low power DDR series memory technology, employs digital buffer devices to buffer signals so that the buffered signals can be correctly processed by an internal circuit of the memory system. If the signal is a command, clock or data signal and the signal quality of the buffered signal is degraded, the internal circuit may interpret the buffered signal incorrectly, causing a problem in the operation of the memory system.

For example, a digital buffer is susceptible to process variations and the process variations may lead to derivations in the rising or falling edges of the buffered signal. It is difficult and time-consuming for a circuit designer to design the digital buffer to guarantee the signal quality of the digital buffer.

BRIEF SUMMARY OF THE INVENTION

An objective of the present disclosure is to provide a digital buffer device with self-calibration. The digital buffer device is capable of detecting circuit characteristic variations of buffer circuits of a type included in the digital buffer device and calibrating one of the buffer circuits to generate an output signal according to an input signal and the detection result.

To achieve at least the above objective, the present disclosure provides a digital buffer device with self-calibration includes a first buffer circuit, a detection circuit, and a calibration circuit. The first buffer circuit has a buffer input terminal for receiving an input signal and a buffer output terminal as output of the digital buffer device. The detection circuit includes at least one second buffer circuit for receiving at least one reference signal and generating at least one detection signal to indicate circuit characteristic variations of the at least one second buffer circuit. The at least one second buffer circuit is of a same type of buffer as the first buffer circuit. The calibration circuit has a calibration input terminal for receiving the input signal, and a calibration output terminal coupled to the buffer output terminal. The calibration circuit is for calibrating the first buffer circuit to generate an output signal according to the input signal and the at least one detection signal.

As such, the digital buffer device is capable of detecting circuit characteristic variations of buffer circuits of a type (e.g., first buffer circuit and second buffer circuit) included in the digital buffer device to generate the at least one detection signal and calibrating the first buffer circuit to generate the output signal according to an input signal and the at least one detection signal. Accordingly, signal quality of the output signal of the digital buffer device can be enhanced.

DETAILED DESCRIPTION OF THE INVENTION

To facilitate understanding of the object, characteristics and effects of this present disclosure, embodiments together with the attached drawings for the detailed description of the present disclosure are provided.

Figure 1:
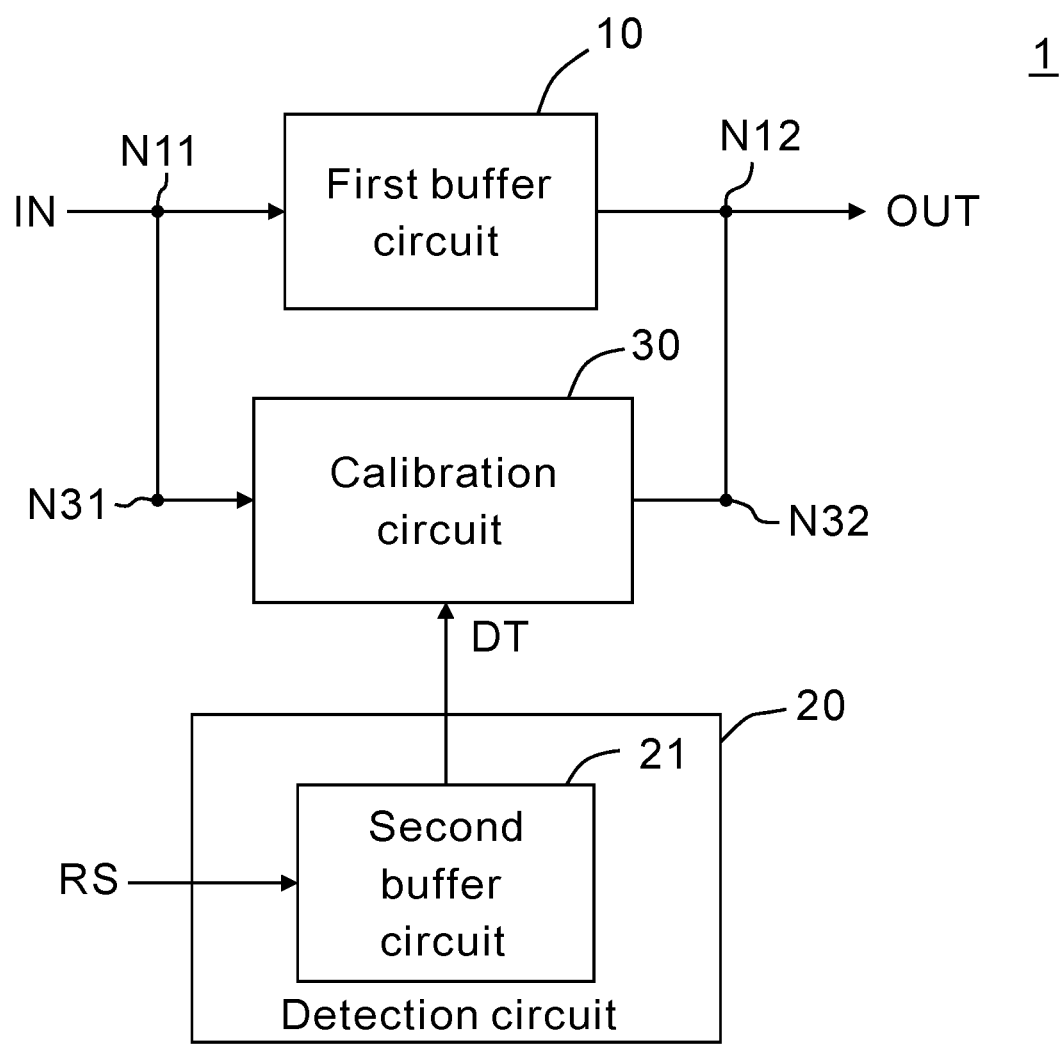
FIG. 1 is a schematic diagram illustrating exemplary architecture of a digital buffer device with self-calibration, representative of various embodiments of the present disclosure.

Referring to FIG. 1, exemplary architecture of a digital buffer device with self-calibration is illustrated, representative of various embodiments of the present disclosure. As shown in FIG. 1, a digital buffer device 1 with self-calibration is capable of detecting circuit characteristic variations of buffer circuits of a type included in the digital buffer device 1 to generate at least one detection signal and calibrating one of the buffer circuits to generate an output signal OUT according to an input signal IN and at least one detection signal (i.e., a detection result). The digital buffer device 1 comprises a first buffer circuit 10, a detection circuit 20, and a calibration circuit 30.

The first buffer circuit 10 has a buffer input terminal N11 for receiving an input signal IN and a buffer output terminal N12.

The detection circuit 20 includes at least one second buffer circuit 21 for receiving at least one reference signal RS and generating at least one detection signal to indicate circuit characteristic variations of the at least one second buffer circuit 21, wherein the at least one second buffer circuit 21 is of a same type of buffer as the first buffer circuit 10.

The calibration circuit 30 has a calibration input terminal N31 for receiving the input signal IN, and a calibration output terminal N32 coupled to the buffer output terminal N12 of the first buffer circuit 10. The calibration circuit 30 is used to calibrate the first buffer circuit 10 to generate an output signal OUT according to the input signal IN and the at least one detection signal DT, wherein the buffer output terminal N12 of the first buffer circuit 10 serves as output of the digital buffer device 1.

Figure 2:
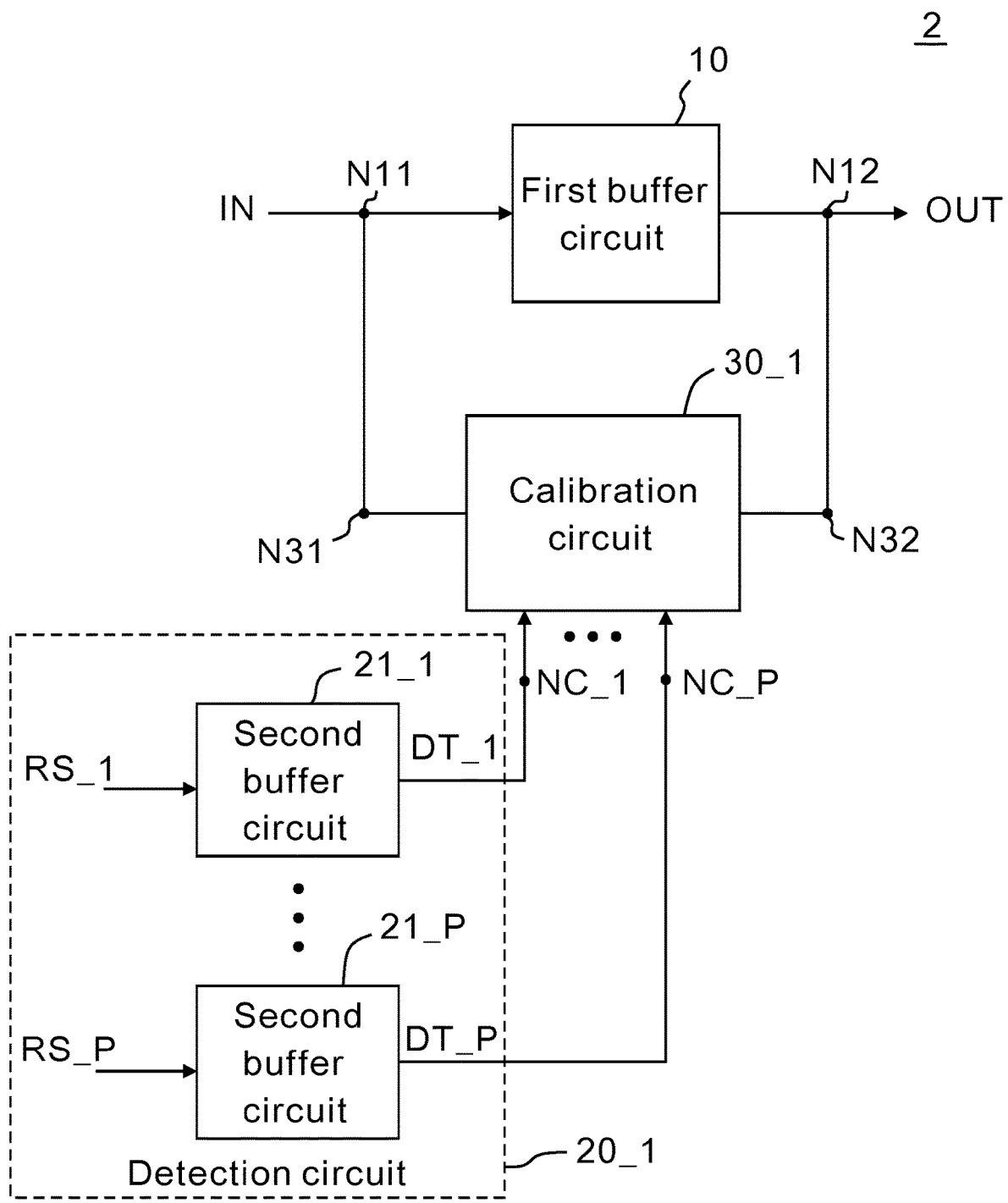
FIG. 2 is a block diagram of an embodiment of a digital buffer device according to the exemplary architecture of FIG. 1.

Referring to FIG. 2, an embodiment of a digital buffer device is shown according to the exemplary architecture of FIG. 1 in a block diagram. As shown in FIG. 2, a digital buffer device 2 comprises a first buffer circuit 10, a detection circuit 20_1, and a calibration circuit 30_1. The first buffer circuit 10 of the digital buffer device 2 is the same as that of the digital buffer device 1, and the connection between the first buffer circuit 10 and the detection circuit 20_1 in FIG. 2 is similar to that between the counterparts in FIG. 1.

As compared to FIG. 1, FIG. 2 further illustrates an embodiment of circuit configuration and connection of the detection circuit 20_1 and the calibration circuit 30_1 of the digital buffer device 2.

In FIG. 2, the detection circuit 20_1 includes a plurality of second buffer circuits 21_1-21_P. The second buffer circuits 21_1-21_P are used for receiving a plurality of different reference signals RS_1-RS_P and generating a plurality of detection signals DT_1-DT_P to indicate the circuit characteristic variations of the plurality of second buffer circuits 21_1-21_P, where P is an integer greater than 1. In this embodiment, the plurality of second buffer circuits 21_1-21_P are of the same type of buffer as the first buffer circuit 10. Thus, the detection signals DT_1-DT_P can be utilized to indicate the circuit characteristic variations of the first buffer circuit 10 as well.

The calibration circuit 30_1 has a calibration input terminal N31, a plurality of calibration terminals NC_1-NC_P, and a calibration output terminal N32. The calibration input terminal N31 is used for receiving the input signal IN. The plurality of calibration terminals NC_1-NC_P are used for receiving the plurality of detection signals DT_1-DT_P respectively. The calibration output terminal N32 is coupled to the buffer output terminal N12 of the first buffer circuit 10. Accordingly, the calibration circuit 30_1 is used to calibrate the first buffer circuit 10 to generate the output signal OUT according to the input signal IN and the plurality of detection signals DT_1-DT_P.

As illustrated above, the digital buffer device 2 utilizes the detection circuit 20_1 to detect circuit characteristic variations of buffer circuits of a type, such as the second buffer circuits 21_1-21_P, to generate the detection signals DT_1-DT_P indicating circuit characteristic variations of the first buffer circuit 10 because the second buffer circuits 21_1-21_P are of the same type of buffer as the first buffer circuit 10. The digital buffer device 2 utilizes the calibration circuit 30_1 to calibrate the first buffer circuit 10 to generate the output signal OUT according to the input signal IN and the detection signals DT_1-DT_P. As shown in FIG. 2, the buffer output terminal N12 of the first buffer circuit 10, which is coupled to the calibration output terminal N32 of the calibration circuit 30, can serve as output of the digital buffer device 2 to generate the output signal OUT.

Further, the first buffer circuit 10 and the plurality of second buffer circuit 21_1-21_P are of the same type of buffer, indicating that these buffer circuits are fabricated in the same or similar structure, and/or by way of same or similar manufacturing processes, and so on. In an example, the first buffer circuit 10 and the second buffer circuit 21_1-21_P are fabricated on the basis of the same circuit architecture of buffer circuit and by the same or similar manufacturing processes in a chip. Accordingly, the second buffer circuits 21_1-21_P exhibit the same or similar circuit characteristic variations as the first buffer circuit 10 does, so that the detection signals DT_1-DT_P generated by the second buffer circuits 21_1-21_P can be configured to appropriately and accurately indicate the circuit characteristic variations as the first buffer circuit 10. Certainly, in some embodiments, the second buffer circuit is of the same type of buffer as the first buffer circuit may be implemented in a same or different size.

In some embodiments, a digital buffer device can be implemented according to the architecture of FIG. 1 as an inverting buffer, a non-inverting buffer, or a tri-state digital buffer. In some examples, the digital buffer device 1 or 2 can be implemented to be a tri-state digital buffer, such as an active high tri-state digital buffer, an active low tri-state digital buffer, or an inverting tri-state digital buffer.

In some embodiments, a digital buffer device can be implemented according to the architecture of FIG. 1 as an integrated circuit (IC) or in an IC, as a building block or a portion of the IC. For example, an input buffer based on the digital buffer device 1 or 2 can be realized in a memory device, such as that compliant with DDR series memory technology or low power DDR (LPDDR) series memory technology.

In scenarios of high data rate signal transmission of the memory system based on DDR or even LPDDR series memory technology, signal quality is critical to robustness of the memory system. The signal quality degradation may occur seriously in one or more process corners.

In this regard, the architecture of the digital buffer device 1 can be configured for detecting process corners at which the digital buffer device 1 (as well as the IC) is fabricated, by way of the detection circuit 20 of the digital buffer device 1. In an embodiment based on FIG. 2, the detection circuit 20_1 of the digital buffer device 2 can be implemented to generate detection signals DT_1-DT_P according to a plurality of different reference signals RS_1-RS_P representing a plurality of input signals at different signal levels (e.g., from lower to higher levels) within an input range of buffer circuits of the same type of buffer. The detection signals DT_1-DT_P indicate the corresponding output signal levels (or logic values) of buffer circuits of the type with respect to the plurality of input signals at different signals levels. In this way, the detection signals DT_1-DT_P can be utilized to indicate a circuit characteristic variation of buffer circuits of the type and the circuit characteristic variation can be associated with a process corner.

Further, the digital buffer device (e.g., 1 or 2) can be configured to calibrate the first buffer circuit (which may be affected by process, voltage, and temperature (PVT) variations at the corresponding process corner), by way of the calibration circuit (e.g., 30 or 30_1) of the digital buffer device (e.g., 1 or 2). The calibration circuit (e.g., 30 or 30_1) can be implemented to determine, according to the input signal IN and the detection signals DT_1-DT_P, whether to calibrate the first buffer circuit 10 with respect to the circuit characteristic variation detected (which corresponds to the process corner) and/or determine which one of a number of calibration (or say compensation) operations provided in the calibration circuit (e.g., 30 or 30_1) can be enabled to calibrate the first buffer circuit 10 to generate the output signal OUT. For example, for a specific process corner at which the first buffer circuit 10 probably outputs signals whose setup time and/or hold time do not meet the requirement, the calibration circuit (e.g., 30 or 30_1) can be implemented to enable a pull-up and/or pull-down voltage to calibrate the first buffer circuit 10 to generate the output signal OUT when the specific process corner is detected. In this manner, the output signal OUT, for example, can be enhanced with improved setup time and/or hold time meeting the requirement.

Typically, the specific process corner at which signal quality probably does not meet the requirement can be found by computer simulations or experiments. When one or more specific process corners are found, circuit designers can design the digital buffer device (e.g., 1 or 2) to be capable of performing calibration (or referred to as self-calibration)

on the first buffer circuit 10 by way of configuring the detection circuit (e.g., 20 or 20_1) and the calibration circuit (e.g., 30 or 30_1).

The following demonstrates exemplary embodiments as to how a digital buffer device can be implemented to be capable of performing calibration (or self-calibration) on the buffer circuit 10 by way of configuring the detection circuit (e.g., 20 or 20_1) and the calibration circuit (e.g., 30 or 30_1).

Figure 3:
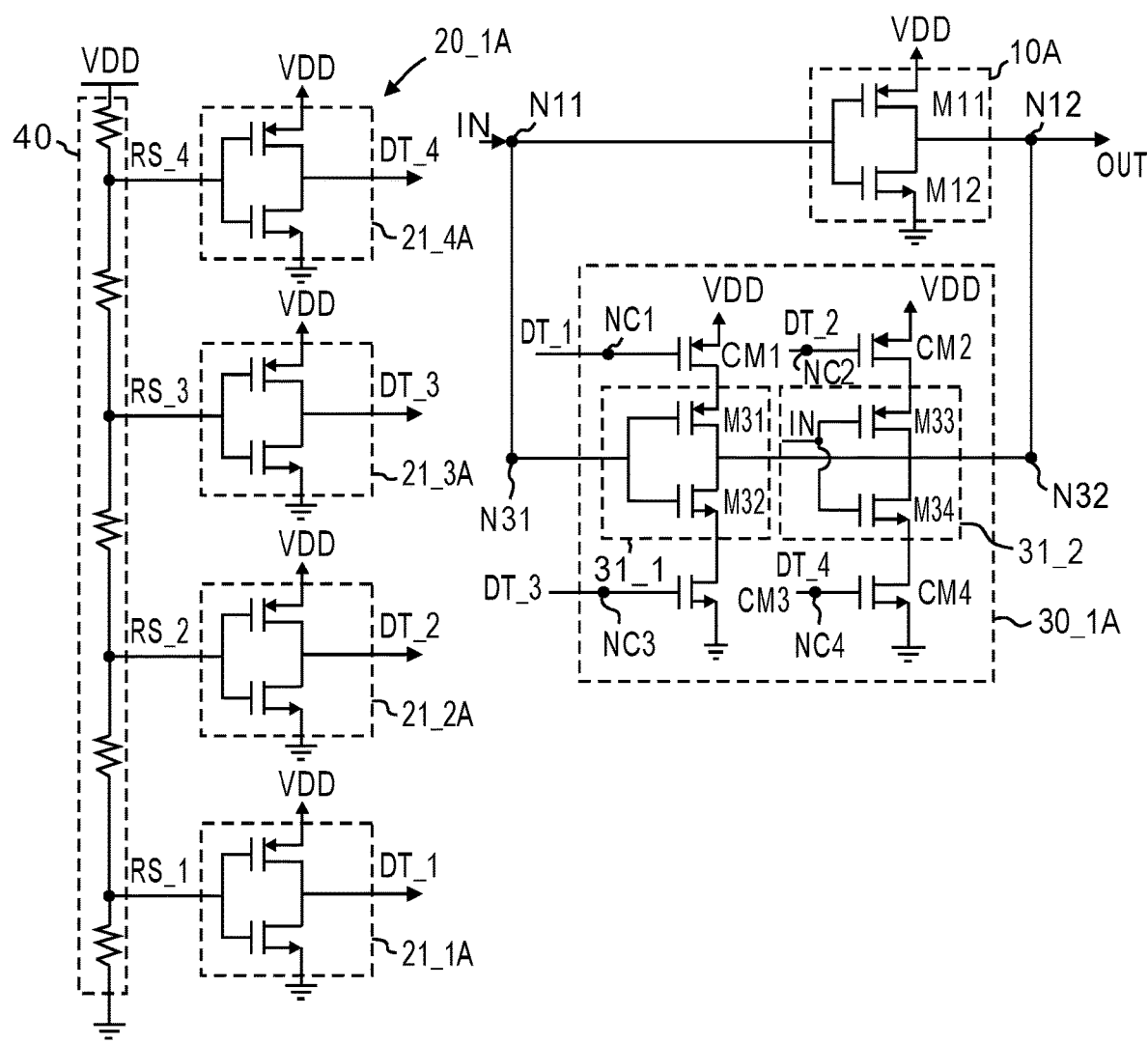
FIG. 3 is a circuit diagram illustrating an embodiment of a digital buffer device according to FIG. 2.

Referring to FIG. 3, an embodiment of a digital buffer device is illustrated according to FIG. 2 in a circuit diagram. As shown in FIG. 3, a digital buffer device 2A comprises a first buffer circuit 10A, a detection circuit 20_1A, and a calibration circuit 30_1A.

The first buffer circuit 10A has a buffer input terminal N11 for receiving an input signal IN and a buffer output terminal N12. The first buffer circuit 10A includes a logic inverter which can be fabricated using any standard technology, such as complementary metal oxide semiconductor (CMOS) or other technology. For the sake of illustration, the first buffer circuit 10A includes a logic inverter which is a CMOS logic inverter. For example, the logic inverter includes a transistor M11 (e.g., P-type metal-oxide-semiconductor field-effect transistors (MOSFET), or PMOS) and a transistor M12 (e.g., N-type MOSFET or NMOS), wherein the control terminals (e.g., gates) of the transistors M11 and M12 are coupled to the buffer input terminal N11, the transistor M11 is coupled between a power supply voltage VDD and the buffer output terminal N12, and the transistor M12 is coupled between the buffer output terminal N12 and the ground (or another power supply voltage).

Figure 4:
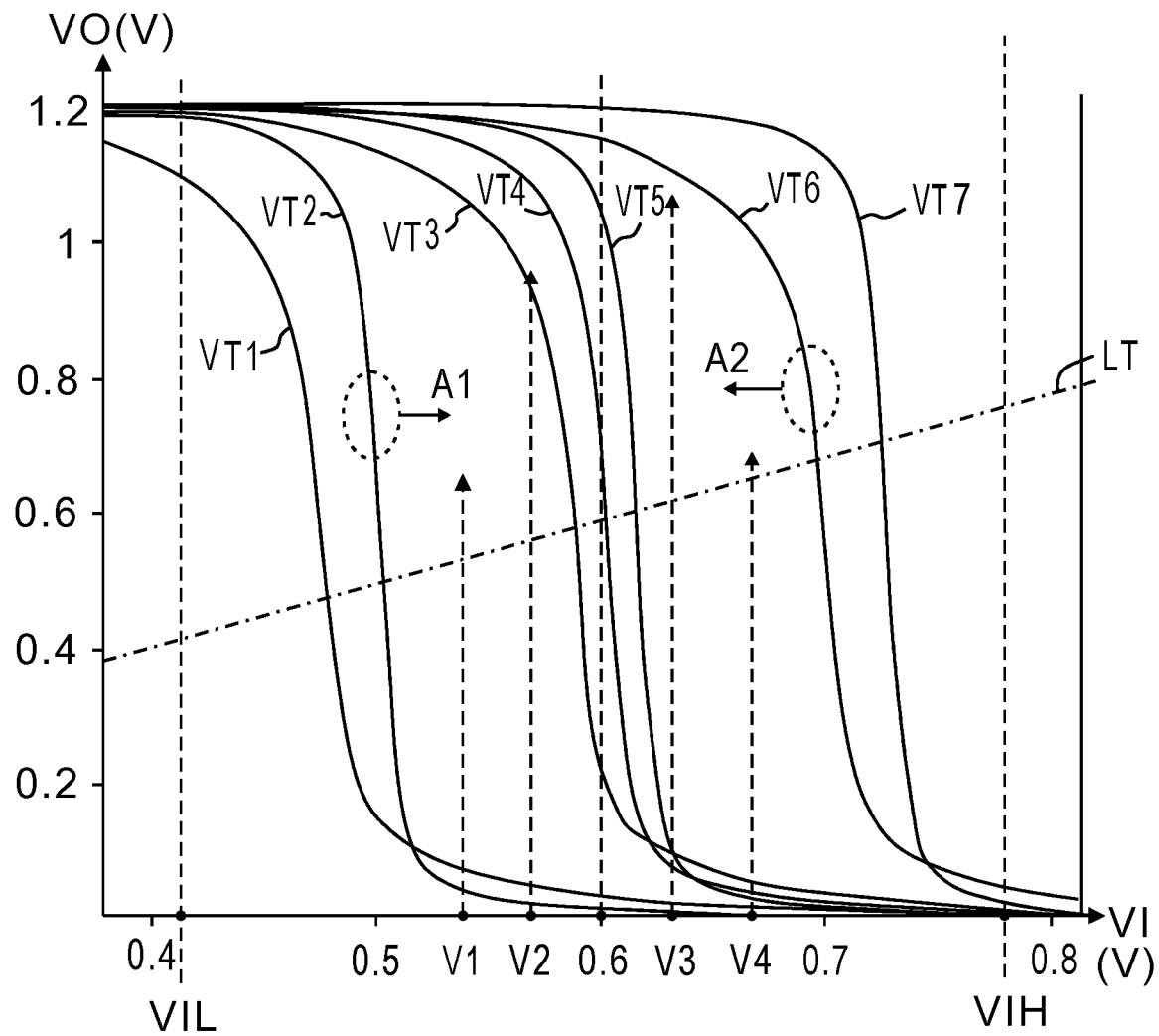
FIG. 4 is a schematic diagram illustrating examples of circuit characteristic variations of buffer circuits of the type in FIG. 3.

Referring to FIG. 4, examples of circuit characteristic variations of buffer circuits of a type (such as the first buffer circuit 10A) in FIG. 3 are illustrated in a schematic diagram. For example, process corner simulations are conducted on the first buffer circuit 10A (e.g., the CMOS logic inverter including the transistor M11 and the transistor M12) of the type, wherein an input signal VI changes from 0 V to 1.2 V, and a corresponding output signal VO is simulated with respect to each of a plurality of process corners. In FIG. 4, each of curves VT1-VT7 represents a portion of a voltage transfer curve corresponding to a specific process corner, and a point on the voltage transfer curve where VO equals VI is the transition threshold of the voltage transfer curve, wherein the intersections of a line LT indicating VO=VI and the curves VT1-VT7 are the corresponding transition thresholds. The following TABLE 1 lists the process corners and associated condition(s) for the curves VT1-VT7.

TABLE 1

| Curve | Process corner | Condition (e.g. temperature in (° C.)) |
| --- | --- | --- |
| VT1 | faster NMOS, slower PMOS (NFPS or FS) | 125 |
| VT2 | NFPS | −40 |
| VT3 | typical NMOS, typical PMOS (NTPT or TT) | 125 |
| VT4 | NTPT | 30 |
| VT5 | NTPT | −40 |
| VT6 | slower NMOS, faster PMOS (NSPF or SF) | 125 |
| VT7 | NSPF | −40 |

Figure 5:
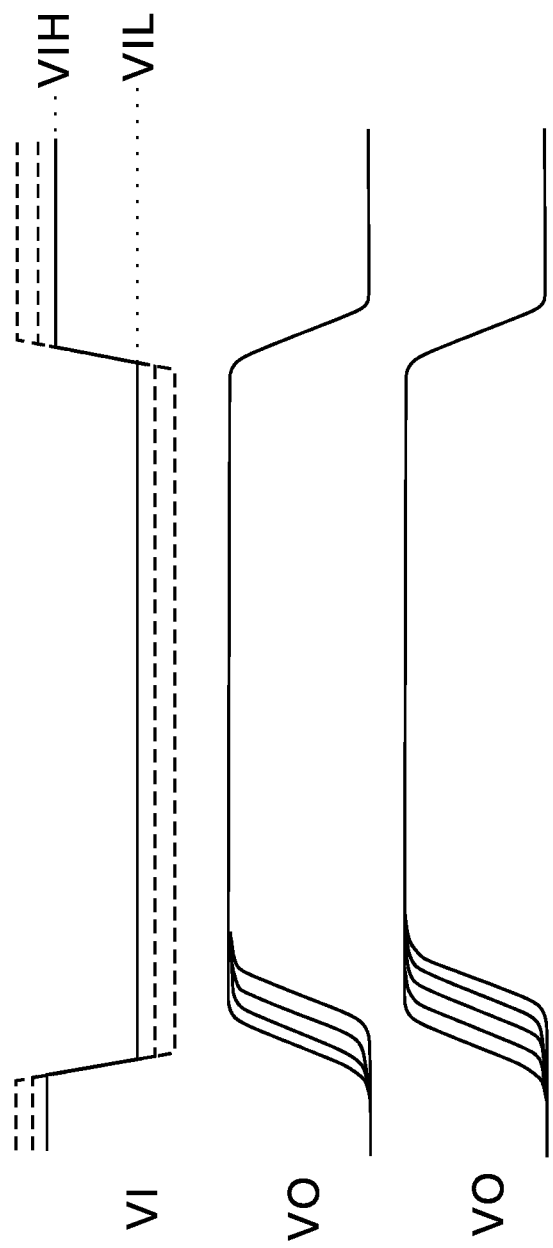
FIG. 5 is a schematic diagram illustrating examples of output signal variations of buffer circuits of the type in FIG. 3.

Referring to FIG. 4, it can be observed that in some process corners such as those indicated by the curves VT1 and VT2, the switching thresholds of these curves are closer to a boundary line indicating a voltage VIL. The voltage VIL is a maximum input voltage that will be recognized as a low input logic level, and the voltage VIL may be required by the requirement of IC products or standard technology. For the cases of the curves VT1 and VT2, if an input signal VI as shown FIG. 5 is applied to the logic inverter, the logic inverter will probably generate an output signal VO with variation, such as jitter, in rising edges when the input signal VI changes from a high voltage level to a low voltage level.

Figure 6:
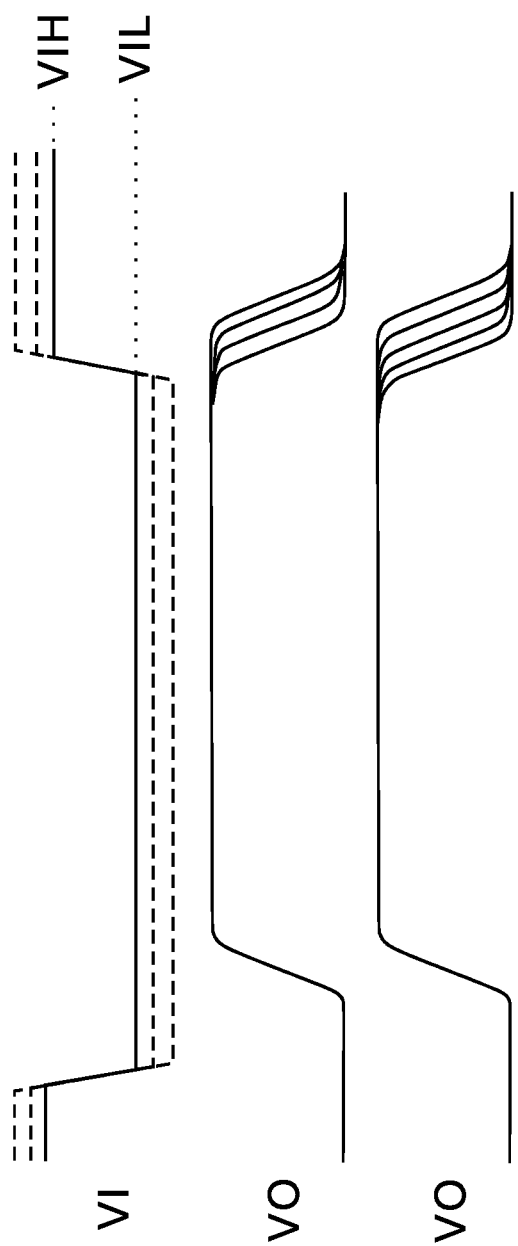
FIG. 6 is a schematic diagram illustrating another example of output signal variations of buffer circuits of the type in FIG. 3.

Referring to FIG. 4, it can also be observed that in some process corners such as those indicated by the curves VT6, VT7, the switching thresholds of these curves are closer to a boundary line indicating a voltage VIH. The voltage VIH is a minimum input voltage that will be recognized as a high input logic level, and the voltage VIH may be required by the requirement of IC products or standard technology. For the cases of the curves VT6 and VT7, if an input signal VI as shown FIG. 6 is applied to the logic inverter, the logic inverter will probably generate an output signal VO with variation, such as jitter, in falling edges when the input signal VI changes from a low voltage level to a high voltage level.

In worse cases, the jitter may occur so that the setup time or hold-up time required for the output signal VO does not meet the requirement or standard that should be compliant with. In this case, if the input signal VI is a command, clock or data signal, and the signal quality (e.g., such as setup time or hold time) of the output signal VO is degraded and no calibration is performed, a subsequent circuit coupled to the logic inverter (e.g., an internal circuit of a memory system) may interpret the output signal VO incorrectly, or the subsequent circuit may undergo malfunction in the worst case.

Accordingly, a circuit designer can design the digital buffer device 2A to be capable of performing calibration (or called self-calibration) on the first buffer circuit 10A (e.g., the logic inverter) by way of configuring the detection circuit 20_1A and the calibration circuit 30_1A.

Referring back to FIG. 3, the detection circuit 20_1A includes a plurality of second buffer circuits 21_1A-21_4A. The second buffer circuits 21_1A-21_4A are used for receiving a plurality of different reference signals RS_1-RS_4 and generating a plurality of detection signals DT_1-DT_4 to indicate the circuit characteristic variations of the plurality of second buffer circuits 21_1A-21_4A. In this embodiment, the plurality of second buffer circuits 21_1A-21_4A are of the same type of buffer as the first buffer circuit 10A, such as the logic inverter including a transistors M11 and M12 as shown in FIG. 3. Thus, the detection signals DT_1-DT_4 can be utilized to indicate the circuit characteristic variations of the first buffer circuit 10A as well. In addition, a voltage divider 40 can be implemented to generate the plurality of different reference signals RS_1-RS_4.

The calibration circuit 30_1A has a calibration input terminal N31, a plurality of calibration terminals NC_1-NC_4, and a calibration output terminal N32. The calibration input terminal N31 is used for receiving the input signal IN. The plurality of calibration terminals NC_1-NC_4 are used for receiving the plurality of detection signals DT_1-DT_4 respectively. The calibration output terminal N32 is coupled to the buffer output terminal N12 of the first buffer circuit 10A. In this manner, the calibration circuit 30_1A is used to calibrate the first buffer circuit 10A to generate the output signal OUT according to the input signal IN and the plurality of detection signals DT_1-DT_4.

In an embodiment, the calibration circuit 30_1A can be implemented based on the buffer circuit which is of the same type of buffer as the first buffer circuit 10A. For example, as shown in FIG. 3, the calibration circuit 30_1A includes a third buffer circuit 31_1, a calibration transistor (e.g., pull-up transistor) CM1, and a calibration transistor (e.g., pull-down transistor) CM3. The third buffer circuit 31_1, coupled between the calibration transistors CM1 and CM3, is of the same type of buffer as the first buffer circuit 10A. The calibration transistor CM1 is coupled between a power supply voltage VDD (e.g., 1.2 V) and the third buffer circuit 31_1, and a calibration terminal NC_1 is coupled to a control terminal of the calibration transistor CM1 for receiving the detection signal DT_1. The calibration transistor CM3 is coupled between the third buffer circuit 31_1 and the ground (or another power supply), and a calibration terminal NC_3 is coupled to a control terminal of the calibration transistor CM3 for receiving the detection signal DT_3. Certainly, in some embodiments, the third buffer circuit is of the same type of buffer as the first buffer circuit may be implemented in a same or different size.

For example, as shown in FIG. 3, the calibration circuit 30_1A further includes a third buffer circuit 31_2, a calibration transistor (e.g., pull-up transistor) CM2, and a calibration transistor (e.g., pull-down transistor) CM4. The third buffer circuit 31_2, coupled between the calibration transistors CM2 and CM4, is of the same type of buffer as the first buffer circuit 10A. The calibration transistor CM2 is coupled between a power supply voltage VDD (e.g., 1.2 V) and the third buffer circuit 31_2, and a calibration terminal NC_2 is coupled to a control terminal of the calibration transistor CM2 for receiving the detection signal DT_2. The calibration transistor CM4 is coupled between the third buffer circuit 31_2 and the ground (or another power supply voltage), and a calibration terminal NC_4 is coupled to a control terminal of the calibration transistor CM4 for receiving the detection signal DT_4.

In addition, as shown in FIG. 3, the buffer input terminals of the third buffer circuits 31_1 and 31_2 are used to receive the input signal IN, for example, by being coupled to the calibration input terminal N31, and the buffer output terminals of the third buffer circuits 31_1 and 31_2 are coupled to the calibration output terminal N32. In an example, the third buffer circuits 31_1 and 31_2 are coupled in parallel between the calibration input terminal N31 and the calibration output terminal N32.

Referring again to FIG. 4, in order to calibrate the first buffer circuit 10A to generate the output signal OUT according to the input signal IN and the plurality of detection signals DT_1-DT_4, the different reference signals can be designed by the circuit designer in view of the process corners at which one or more worse cases probably occur and calibration is required to be performed. Accordingly, a number of voltage values, V1, V2, V3, V4 (e.g., 0.54 V, 0.57 V, 0.63 V, 0.66 V), for example, are selected and are represented by dashed lines shown in FIG. 4, respectively, as threshold values for activation of calibration.

The voltage values V1-V4 as threshold values for activation of calibration are discussed below. Referring to FIG. 4, it is mentioned above that the switching threshold of the curve VT1 (or VT2) is close to the boundary line indicating the voltage VIL, leading to greater jitter. In order to reduce jitter, it is desirable for the digital buffer device 2A to calibrate the first buffer circuit 10A in the case of the curve VT1 (or VT2) so that a voltage transfer curve of the calibrated first buffer circuit 10A (or regarded as the digital buffer device 2A generating the output signal OUT at the buffer output terminal N12) has its switching threshold being shifted towards the right side and close to the middle voltage between the voltages VIL and VIH. The voltages VIL and VIH can be set based on the power supply voltage VDD; for example, if VDD=1.2 V, VIL=0.35*VDD=0.42 V and VIH=0.65*VDD=0.78 V, and the middle voltage is 0.6 V. Accordingly, the voltages V1, V2 (e.g., 0.54 V, 0.57 V) can be selected as the voltage level of the reference signals RS_1 and RS_2, respectively. If the logic inverter (e.g., second buffer circuit 21_2A) outputs an output signal VO indicating a logic 0 at the input signal VI of 0.57 V, it indicates that the calibration circuit 30_1A is required to calibrate the first buffer circuit 10A so that the voltage transfer curve of the calibrated first buffer circuit 10A has its switching threshold being shifted towards the right side. If the logic inverter (e.g., second buffer circuit 21_1A) outputs an output signal VO indicating a logic 0 at the input signal VI of 0.54V, it indicates that the calibration circuit 30_1A is required to greatly calibrate the first buffer circuit 10A (e.g., in the case of the curve VT1 or VT2) so that the voltage transfer curve of the calibrated first buffer circuit 10A has its switching threshold being shifted towards the right side, as illustrated by an arrow A1 associated with the curve VT2, for example.

On the other hand, as discussed above, the switching threshold of the curve VT6 (or VT7) in FIG. 4 is close to the boundary line indicating the voltage VIH, leading to greater jitter. In order to reduce jitter, it is desirable for the digital buffer device 2A to calibrate the first buffer circuit 10A in the case of the curve VT6 (or VT7) so that a voltage transfer curve of the calibrated first buffer circuit 10A has its switching threshold being shifted towards the left side and close to the middle voltage between the voltages VIL and VIH. Accordingly, the voltages V3, V4 (e.g., 0.63 V, 0.66 V) can be selected as the voltage level of the reference signals RS_3 and RS_4, respectively. If the logic inverter (e.g., second buffer circuit 21_3A) outputs an output signal VO indicating a logic 1 at the input signal VI of 0.63V, it indicates that the calibration circuit 30_1A is required to calibrate the first buffer circuit 10A so that the voltage transfer curve of the calibrated first buffer circuit 10A has its switching threshold being shifted towards the left side. If the logic inverter (e.g., second buffer circuit 21_4A) outputs an output signal VO indicating a logic 1 at the input signal VI of 0.66V, it indicates that the calibration circuit 30_1A is required to greatly calibrate the first buffer circuit 10A (e.g., in the case of the curve VT6 or VT7) so that the voltage transfer curve of the calibrated first buffer circuit 10A has its switching threshold being shifted towards the left side, as illustrated by an arrow A2 associated with the curve VT6, for example.

Further, in some cases, if the logic inverter (e.g., second buffer circuits 21_1A-21_4A) indicates a voltage transfer curve as indicated by the curve VT3, VT4 or VT5, it is desirable for the digital buffer device 2A to maintain the voltage transfer curve and calibration may be unnecessary.

From the above discussion about FIG. 4, the cases at which the digital buffer device 2A requires calibration can be derived from the process corner simulations of the input buffer circuit 10A (e.g., the logic inverter). In addition, the voltage values V1-V4 can be determined and associated with the threshold values for activation of calibration. In order to implement the calibration, the reference signals RS_1-RS_4 can be set to the voltage values V1-V4 respectively so that the corresponding detection signals DT_1-DT_4 can be generated by the detection circuit 20_1A to indicate the circuit characteristic variations of buffer circuits of the type, wherein the second buffer circuits 21_1A-21_4A of the detection circuit 20_1A are of the same type of buffer of the first buffer circuit 10A. The calibration circuit 30_1A can be implemented to include a plurality of third buffer circuits (e.g., 31_1 and 31_2) and a plurality of calibration transistors (e.g., CM1-CM4). Accordingly, the calibration circuit 30_1A is capable of perform calibration according to the input signal IN and the detection signals DT_1-DT_4 in view of the above discussions for calibration about FIG. 4. The implementation of the calibration by the digital buffer device 2A can be summed up by the following TABLE 2. In TABLE 2, the circuit characteristic variations can be classified into 5 cases and the digital buffer device 2A provides 5 calibration modes, for example, wherein each of the calibration modes corresponds to one of calibration operations that the calibration circuit 30_1A provides. Further, the detection signals DT_1-DT_4, the reference signals RS_1-RS_4, and turning on or off of the calibration transistors CM1-CM4 are associated and specified in TABLE 2, wherein "L" indicates a logic 0 or a low logic level while "H" indicates a logic 1 or a high logic level.

tions from the low voltage level to the high voltage level, the transistor M11 of the first buffer circuit 10A, the transistor M31 of the third buffer circuit 31_1, and the transistor M33 of the third buffer circuit 31_2 are turned off while the transistor M12 of the first buffer circuit 10A is turned on. Meanwhile, the transistor M32 of the third buffer circuit 31_1 and the transistor M34 of the third buffer circuit 31_2 are turned off because the calibration transistors CM3 and CM4 are turned off in the calibration mode 1. In this manner, when the input signal IN transitions from the low voltage level to the high voltage level, the detection circuit 20_1A does not perform calibration operation in the calibration mode 1. As a whole, the detection circuit 20_1A performs the calibration operation in the calibration mode 1 after the input signal IN transitions from the high voltage level to the low voltage level. Thus, the voltage transfer curve of the calibrated first buffer circuit 10A can be shifted towards the right side for a positive voltage value (e.g., about 60 mV).

TABLE 2

| Detection signals | Calibration mode | | | | | Reference signal |
|---|---|---|---|---|---|---|
| | 1 | 2 | 3 | 4 | 5 | |
| DT_1 | L (CM1: ON) | H (CM1: OFF) | H (CM1: OFF) | H (CM1: OFF) | H (CM1: OFF) | RS_1: 0.54 V |
| DT_2 | L (CM2: ON) | L (CM2: ON) | H (CM2: OFF) | H (CM2: OFF) | H (CM1: OFF) | RS_2: 0.57 V |
| DT_3 | L (CM3: OFF) | L (CM3: OFF) | L (CM3: OFF) | H (CM3: ON) | H (CM3: ON) | RS_3: 0.66 V |
| DT_4 | L (CM4: OFF) | L (CM4: OFF) | L (CM4: OFF) | L (CM4: OFF) | H (CM4: ON) | RS_4: 0.66 V |
| For cases | Switching threshold closer to the boundary line for VIL | Switching threshold close to the boundary line for VIL | Normal | Switching threshold close to the boundary line for VIH | Switching threshold closer to the boundary line for VIH | |
| Calibration | Shifting the voltage transfer curve more towards the right side | Shifting the voltage transfer curve towards the right side | Maintaining the voltage transfer curve | Shifting the voltage transfer curve towards the left side | Shifting the voltage transfer curve more towards the left side | |

Referring to TABLE 2, when the detection circuit 20_1A outputs the detection signals DT_1-DT_4 corresponding to logic values L, L, L, L, respectively, it indicates that the switching threshold of the voltage transfer curve of the first buffer circuit 10A is closer to the boundary line indicating the voltage VIL. In this case, the detection circuit 20_1A is configured to be in a calibration mode 1 according to the detection signals DT_1-DT_4, where the calibration transistors CM1 and CM2 are turned on while the calibration transistors CM3 and CM4 are turned off. When an input signal IN, which is applied to the first buffer circuit 10A, the third buffer circuits 31_1 and 31_2, transitions from a high voltage level to a low voltage level, the transistor M11 of the first buffer circuit 10A, a transistor M31 of the third buffer circuit 31_1, and a transistor M33 of the third buffer circuit 31_2 are turned on, while the transistor M12 of the first buffer circuit 10A, a transistor M32 of the third buffer circuit 31_1, and a transistor M34 of the third buffer circuit 31_2 are turned off. Because the buffer output terminal N12 of the first buffer circuit 10A is coupled to the buffer output terminals of the third buffer circuits 31_1 and 31_2 through the calibration output terminal N32, after the input signal IN transitions from the high voltage level to the low voltage level, the pull-up voltages generated through the turning on of the calibration transistors CM1 and CM2 can be applied to the buffer output terminal N12 so that the voltage level at the buffer output terminal N12 will be increased faster, thus leading to reduction of jitter in rising edges of the output signal OUT. Conversely, when the input signal IN transi- Referring to TABLE 2, when the detection circuit 20_1A outputs the detection signals DT_1-DT_4 corresponding to logic values H, L, L, L, respectively, it indicates that the switching threshold of the voltage transfer curve of the first buffer circuit 10A is close to the boundary line indicating the voltage VIL. In this case, the detection circuit 20_1A is configured to be in a calibration mode 2 according to the detection signals DT_1-DT_4, where the calibration transistor CM2 is turned on while the calibration transistors CM1, CM3, and CM4 are turned off. Accordingly, the third buffer circuit 31_1 is off because the calibration transistors CM1 and CM3 are turned off in the calibration mode 2. When the input signal IN transitions from the high voltage level to the low voltage level, the transistor M11 of the first buffer circuit 10A and the transistor M33 of the third buffer circuit 31_2 are turned on, while the transistor M12 of the first buffer circuit 10A and the transistor M34 of the third buffer circuit 31_2 are turned off. Because the buffer output terminal N12 of the first buffer circuit 10A is coupled to the buffer output terminals of the third buffer circuits 31_1 and 31_2 through the calibration output terminal N32, after the input signal IN transitions from the high voltage level to the low voltage level, the pull-up voltage generated through the turning on of the calibration transistor CM2 can be applied to the buffer output terminal N12 so that the voltage level at the buffer output terminal N12 will be increased faster, thus leading to reduction of jitter in rising edges of the output signal OUT. Conversely, when the input signal IN transitions from the low voltage level to the high voltage level, the transistor M11 of the first buffer circuit 10A and the transistor M33 of the third buffer circuit 31_2 are turned off while the transistor M12 of the first buffer circuit 10A is turned on. Meanwhile, the transistor M34 of the third buffer circuit 31_2 is turned off because the calibration transistor CM4 is turned off in the calibration mode 2. In this manner, when the input signal IN transitions from the low voltage level to the high voltage level, the detection circuit 20_1A does not perform calibration operation in the calibration mode 2. As a whole, the detection circuit 20_1A performs the calibration operation in the calibration mode 2 after the input signal IN transitions from the high voltage level to the low voltage level. Thus, the voltage transfer curve of the calibrated first buffer circuit 10A can be shifted towards the right side for a positive voltage value (e.g., about 30 mV).

Referring to TABLE 2, when the detection circuit 20_1A outputs the detection signals DT_1-DT_4 corresponding to logic values H, H, L, L, respectively, it indicates that the voltage transfer curve of the first buffer circuit 10A is as normal as that indicated by the curve VT3, VT4, or VT5 shown in FIG. 3. In this case, the detection circuit 20_1A is configured to be in a calibration mode 3 according to the detection signals DT_1-DT_4, where the calibration transistors CM1, CM2, CM3, and CM4 are all turned off. Accordingly, the third buffer circuits 31_1 and 31_2 are off in the calibration mode 3. The detection circuit 20_1A performs no calibration operation (or a special calibration operation) on the first buffer circuit 10A in the calibration mode 3. In other words, the detection circuit 20_1A performs internal calibration operation to maintain the voltage transfer curve of the first buffer circuit 10A in the calibration mode 3. Thus, in the calibration mode 3, the voltage transfer curve of the first buffer circuit 10A is maintained.

Referring to TABLE 2, when the detection circuit 20_1A outputs the detection signals DT_1-DT_4 corresponding to logic values H, H, H, L, respectively, it indicates that the switching threshold of the voltage transfer curve of the first buffer circuit 10A is close to the boundary line indicating the voltage VIH. In this case, the detection circuit 20_1A is configured to be in a calibration mode 4 according to the detection signals DT_1-DT_4, where the calibration transistor CM3 is turned on while the calibration transistors CM1, CM2, and CM4 are turned off. Accordingly, the third buffer circuit 31_2 is off because the calibration transistors CM2 and CM4 are turned off in the calibration mode 4. When the input signal IN transitions from the high voltage level to the low voltage level, the transistor M11 of the first buffer circuit 10A is turned on. The third buffer circuit 31_1 is turned off because the transistor M31 of the third buffer circuit 31_1 is turned off due to the calibration transistor CM1 being turned off in the calibration mode 4 and the transistor M32 of the third buffer circuit 31_1 is turned off after the input signal IN transitions from the high voltage level to the low voltage level. In this manner, when the input signal IN transitions from the high voltage level to the low voltage level, the detection circuit 20_1A does not perform calibration operation in the calibration mode 4. Conversely, when the input signal IN transitions from the low voltage level to the high voltage level, the transistor M11 of the first buffer circuit 10A and the transistor M31 of the third buffer circuit 31_1 are turned off while the transistor M12 of the first buffer circuit 10A and the transistor M32 of the third buffer circuit 31_1 are turned on. Because the buffer output terminal N12 of the first buffer circuit 10A is coupled to the buffer output terminals of the third buffer circuits 31_1 and 31_2 through the calibration output terminal N32, after the input signal IN transitions from the low voltage level to the high voltage level, the pull-down voltage generated through the turning on of the calibration transistor CM3 can be applied to the buffer output terminal N12 so that the voltage level at the buffer output terminal N12 will be decreased faster, thus leading to reduction of jitter in falling edges of the output signal OUT. As a whole, the detection circuit 20_1A performs the calibration operation in the calibration mode 4 after the input signal IN transitions from the low voltage level to the high voltage level. Thus, the voltage transfer curve of the calibrated first buffer circuit 10A can be shifted towards the left side for a positive voltage value (e.g., about 30 mV).

Referring to TABLE 2, when the detection circuit 20_1A outputs the detection signals DT_1-DT_4 corresponding to logic values H, H, H, H, respectively, it indicates that the switching threshold of the voltage transfer curve of the first buffer circuit 10A is closer to the boundary line indicating the voltage VIH. In this case, the detection circuit 20_1A is configured to be in a calibration mode 5 according to the detection signals DT_1-DT_4, where the calibration transistors CM1 and CM2 are turned off while the calibration transistors CM3 and CM4 are turned on. When the input signal IN transitions from the high voltage level to the low voltage level, the transistor M11 of the first buffer circuit 10A is turned on while the transistor M12 of the first buffer circuit 10A is turned off. Meanwhile, the third buffer circuits 31_1 and 31_2 are turned off because the transistor M31 of the third buffer circuit 31_1 and the transistor M33 of the third buffer circuit 31_2 are turned off due to the calibration transistors CM1 and CM2 being turned off in the calibration mode 5 while the transistor M32 of the third buffer circuit 31_1 and the transistor M34 of the third buffer circuit 31_2 are turned off after the input signal IN transitions from the high voltage level to the low voltage level. In this manner, when the input signal IN transitions from the high voltage level to the low voltage level, the detection circuit 20_1A does not perform calibration operation in the calibration mode 5. Conversely, when the input signal IN transitions from the low voltage level to the high voltage level, the transistor M11 of the first buffer circuit 10A, the transistor M31 of the third buffer circuit 31_1, and the transistor M33 of the third buffer circuit 31_2 are turned off, while the transistor M12 of the first buffer circuit 10A, the transistor M32 of the third buffer circuit 31_1, and the transistor M34 of the third buffer circuit 31_2 are turned on. Because the buffer output terminal N12 of the first buffer circuit 10A is coupled to the buffer output terminals of the third buffer circuits 31_1 and 31_2 through the calibration output terminal N32, after the input signal IN transitions from the low voltage level to the high voltage level, the pull-down voltages generated through the turning on of the calibration transistors CM3 and CM4 can be applied to the buffer output terminal N12 so that the voltage level at the buffer output terminal N12 will be decreased faster, thus leading to reduction of jitter in falling edges of the output signal OUT. As a whole, the detection circuit 20_1A performs the calibration operation in the calibration mode 5 after the input signal IN transitions from the high voltage level to the low voltage level. Thus, the voltage transfer curve of the calibrated first buffer circuit 10A can be shifted towards the left side for a positive voltage value (e.g., about 60 mV).

In the implementation of the digital buffer device 2A, the number of third buffer circuits is determined by the designer for calibration purposes. It is possible that in some embodiments, one, two or more third buffer circuits can be utilized. In addition, the designer can also determine the number of calibration transistors (such as pull-up or pull-down transistors or other circuit components of the same functionality) whenever appropriate for calibration purposes. For example, the calibration transistors CM1-CM4 are optional and the calibration circuit 30_1A may include one, two, or three of calibration transistors only. In some examples based on the digital buffer device 2A, the calibration circuit 30_1A can be implemented to include three or more of third buffer circuits with more than four calibration transistors, while the detection circuit 20_1A can be implemented to provide corresponding detection signals for controlling the calibration transistors selectively for calibration purposes in a way similar to that as illustrated above for the example of FIG. 3.

Figure 7:
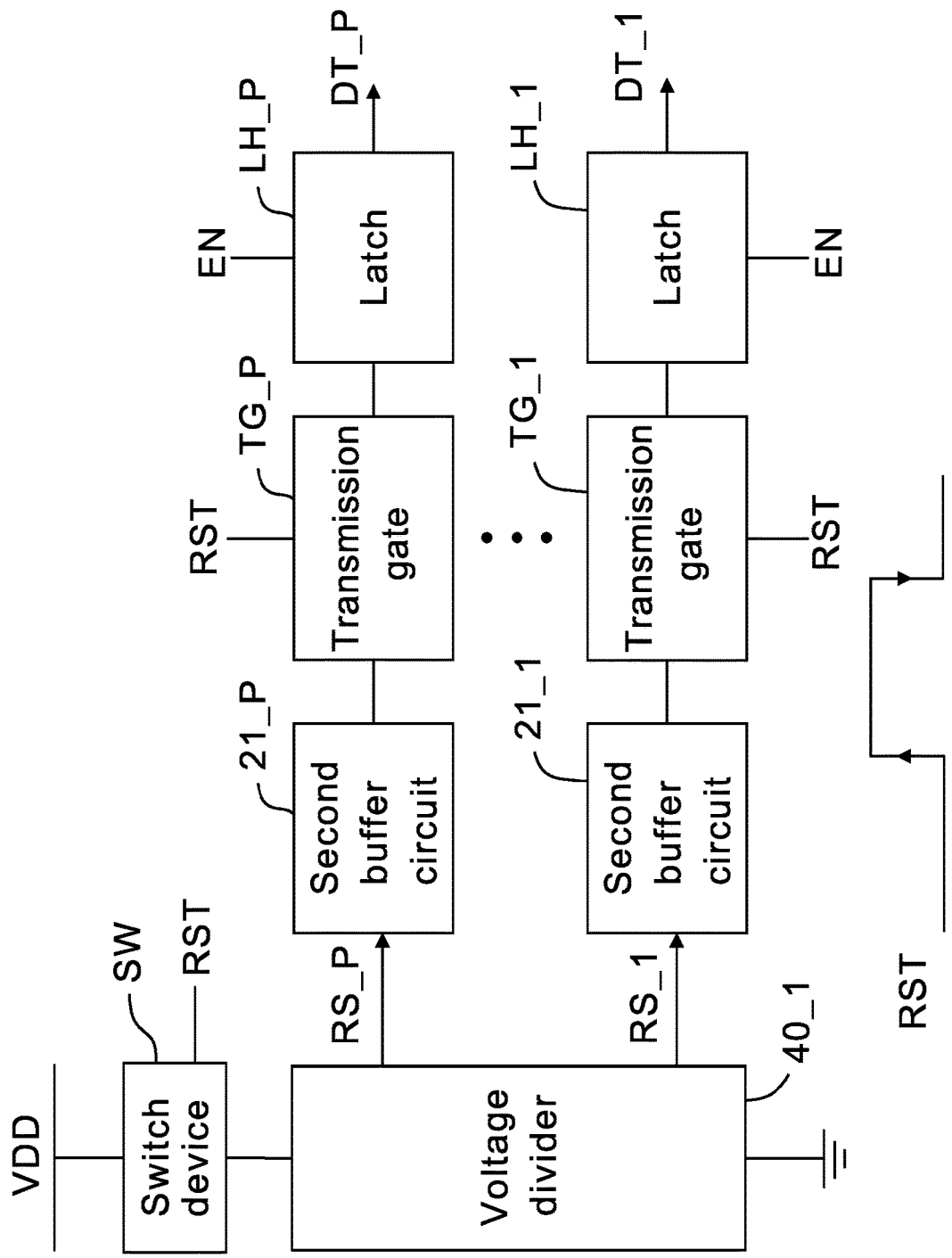
FIG. 7 is a block diagram illustrating another embodiment of a detection circuit.

Further, the digital buffer device (e.g., 1, 2, or 2A) can be further implemented with power saving mechanism with respect to the detection circuit. Referring to FIG. 7, another embodiment of the detection circuit (e.g., 20, 20_1, or 20_1A) is illustrated in a block diagram. As compared with the detection circuit 20, 20_1, or 20_1A, a detection circuit 20_2 in FIG. 7 further includes transmission gates and a storage circuit (such as latches) for power saving.

As shown in FIG. 7, the detection circuit 20_2 includes a plurality of second buffer circuits 21_1-21_P, a plurality of transmission gates TG_1-TG_P, and a storage circuit including a plurality of latches LH_1-LH_P. Each of the plurality of second buffer circuits 21_1-21_P is coupled to a corresponding transmission gate and latch. The plurality of second buffer circuits 21_1-21_P are used for receiving a plurality of different reference signals RS_1-RS_P respectively and generating a plurality of detection signals DT_1-DT_P to indicate the circuit characteristic variations of the plurality of second buffer circuits 21_1-21_P, where P is an integer greater than 1. The plurality of second buffer circuits 21_1-21_P are of the same type of buffer as the first buffer circuit 10. Thus, the detection signals DT_1-DT_P can be utilized to indicate the circuit characteristic variations of the first buffer circuit 10 as well. The second buffer circuits 21_1-21_P generate respective output signals (e.g., detection signals DT_1-DT_P) and the transmission gates TG_1-TG_P output the respective output signals when a reset signal applied to the transmission gates TG_1-TG_P is asserted (e.g., a high voltage level or logic 1), as illustrated by a waveform in the lower portion of FIG. 7. When an enabling signal EN applied to the latches LH_1-LH_P is asserted (e.g., a high voltage level or logic 1), the respective output signals of the second buffer circuits 21_1-21_P will be stored by the latches LH_1-LH_P and the latches LH_1-LH_P outputs the detection signals DT_1-DT_P. After the latches LH_1-LH_P outputs the detection signals DT_1-DT_P and the calibration circuit (e.g., 30_1 or 30_1A) performs calibration operation according to the detection signals DT_1-DT_P, a device (e.g., a voltage divider 40 in FIG. 3) that generates the plurality of reference signals RS_1-RS_P can be cut off and the second buffer circuits 21_1-21_P can then be turned off as well. For example, as illustrated in FIG. 7, a switch device SW is coupled between a power supply voltage VDD and a voltage divider 40_1. The voltage divider 40_1 in FIG. 7 can be implemented according to the voltage divider 40 in FIG. 3. The switch device SW is controlled by the reset signal RST. For example, after the reset signal RST undergoes a rising edge and a falling edge, as illustrated by the waveform in the lower portion of FIG. 7, the switch device SW can be set to turn off so that the voltage divider 40_1 is cut off and the second buffer circuits 21_1-21_P can then be turned off as well. In this manner, the detection circuit 20_2 in FIG. 7 can further save power, in addition to performing the similar functionality as the detection circuit 20 in FIG. 2. For example, the switch device SW can be implemented by a logic circuit.

In the above embodiments in FIG. 7, the transmission gates are optional and the latches can be coupled to the second buffer circuits with or without transmission gates, or other implementation can be applied in order to store the detection signals. In addition, the functionality of the switch device SW and the voltage divider 40_1 can be modified or implemented by other appropriate circuit arrangement.

Further, in the above embodiments, for the sake of control, power saving or other purpose, the buffer circuits (e.g., the first buffer circuit and second buffer circuits as exemplified above) can be implemented to be an inverting tri-state buffer circuit. For example, some logic circuits can be added to the buffer circuits (e.g., the first buffer circuit and second buffer circuits as exemplified above) in order to enable or disable the buffer circuits by one or more control signals. For example, some logic circuits can be added to the buffer circuits (e.g., the first buffer circuit and second buffer circuits as exemplified above) in order to enable or disable the delivery of the power supply voltages to the buffer circuits by one or more control signals for power saving.

In further embodiments, an input buffer for receiving a clock enable signal can be implemented according to the digital buffer device (e.g., 1, 2, or 2A) to fulfil the requirements of double data rate (DDR) series memory standards (such as one of DDR1, DDR2, DDR3, DDR4, LPDDR1, LPDDR2, LPDDR3, LPDDR4 standards). The digital buffer device can be realized as an inverting buffer and the clock enable signal serves as the input signal IN. Certainly, the implementation of the invention is not limited to the above examples.

As illustrated above, the embodiments of the digital buffer device are capable of detecting circuit characteristic variations of buffer circuits of a type included in the digital buffer device to generate one or more detection signals and calibrating one of the buffer circuits to generate an output signal according to an input signal and the one or more detection signals. Accordingly, signal quality of the output signal of the digital buffer device can be enhanced. In some of the embodiments, the digital buffer device can be further implemented with power saving mechanism.

While the present disclosure has been described by way of specific embodiments, numerous modifications, combinations, and variations could be made thereto by those skilled in the art without departing from the scope and spirit of the present disclosure set forth in the claims.

What is claimed is:

1. A digital buffer device with self-calibration, comprising:

a first buffer circuit having a buffer input terminal for receiving an input signal and a buffer output terminal;

a detection circuit including at least one second buffer circuit for receiving at least one reference signal and generating at least one detection signal to indicate circuit characteristic variations of the at least one second buffer circuit, wherein the at least one second buffer circuit is of a same type of buffer as the first buffer circuit; and a calibration circuit having a calibration input terminal for receiving the input signal, and a calibration output terminal coupled to the buffer output terminal, the calibration circuit being used to calibrate the first buffer circuit to generate an output signal according to the input signal and the at least one detection signal, wherein the buffer output terminal serves as output of the digital buffer device;

wherein the detection circuit includes a plurality of second buffer circuits for receiving a plurality of different reference signals and generating a plurality of detection signals to indicate the circuit characteristic variations of the plurality of second buffer circuits, wherein the plurality of second buffer circuits are of the same type of buffer as the first buffer circuit.

2. The digital buffer device according to claim 1, wherein the calibration circuit is used to calibrate the first buffer circuit to generate the output signal according to the input signal and the plurality of detection signals.

3. The digital buffer device according to claim 2, wherein the plurality of different reference signals corresponds to a plurality voltage values between a maximum input voltage that is to be recognized as a low input logic level for the digital buffer device and a minimum input voltage that is to be recognized as a high input logic level for the digital buffer device.

4. The digital buffer device according to claim 2, wherein the calibration circuit further has a plurality of calibration terminals for receiving the plurality of detection signals.

5. The digital buffer device according to claim 1, wherein the calibration circuit includes a third buffer circuit and at least one calibration transistor, wherein the third buffer circuit is coupled to the at least one calibration transistor and is used for receiving the input signal, the third buffer circuit is coupled to the calibration output terminal, and the third buffer circuit and the at least one calibration transistor are used to calibrate the first buffer circuit to generate the output signal according to the input signal and the at least one detection signal.

6. The digital buffer device according to claim 5, wherein the third buffer circuit is of the same type of buffer as the first buffer circuit.

7. The digital buffer device according to claim 1, wherein the calibration circuit includes a plurality of third buffer circuits and a plurality of calibration transistors, wherein each of the plurality of third buffer circuits is coupled to at least a corresponding one of the plurality of calibration transistors and is used for receiving the input signal, each of the plurality of third buffer circuits is coupled to the calibration output terminal, and the plurality of third buffer circuits and the plurality of calibration transistors are used to calibrate the first buffer circuit to generate the output signal according to the input signal and the plurality of detection signals.

8. The digital buffer device according to claim 7, wherein the plurality of third buffer circuits are of the same type of buffer as the first buffer circuit.

9. The digital buffer device according to claim 1, wherein the detection circuit further includes a storage circuit, wherein the storage circuit is coupled to the at least one second buffer circuit; the at least one second buffer circuit is configured to cut off for power saving after the storage circuit stores the at least one detection signal corresponding to the at least one second buffer circuit.

10. The digital buffer device according to claim 9, wherein the detection circuit further includes a voltage divider for generating the least one reference signal, wherein the voltage divider is configured to cut off for power saving after the storage circuit stores the at least one detection signal corresponding to the at least one second buffer circuit.

11. The digital buffer device according to claim 1, wherein the first buffer circuit includes a logic inverter.

* * * * *